United States Patent
Zhu (10) Patent No.: US 11,502,509 B2
(45) Date of Patent: Nov. 15, 2022

(54) JUMPER CABLE AND METHOD TO JUMP START AN AUTOMOBILE

(71) Applicants: SHENZHEN CAROSS CO., LTD, Shenzhen (CN); SHENZHEN JIEQI DIGITAL TECHNOLOGY CO., LTD, Shenzhen (CN)

(72) Inventor: Chunyi Zhu, Lianyuan (CN)

(73) Assignees: SHENZHEN CAROSS CO., LTD, Shenzhen (CN); SHENZHEN JIEQI DIGITAL TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/200,889

(22) Filed: Mar. 14, 2021

(65) Prior Publication Data

US 2022/0045505 A1  Feb. 10, 2022

(30) Foreign Application Priority Data

Aug. 6, 2020  (CN) .......................... 202010783788.3

(51) Int. Cl.
*H02H 7/20* (2006.01)
*H02H 1/00* (2006.01)
(Continued)

(52) U.S. Cl.
CPC ............ *H02H 7/20* (2013.01); *H02H 1/0007* (2013.01); *B60S 5/00* (2013.01); *G01R 31/58* (2020.01)

(58) Field of Classification Search
CPC .. F02N 11/08; F02N 11/0862; F02N 11/0866; F02N 11/10; F02N 11/14;
(Continued)

(56) References Cited

U.S. PATENT DOCUMENTS 9,007,015 B1    4/2015  Nook et al.
10,148,105 B2 * 12/2018 Lei ........................ H02J 7/0029
(Continued)

FOREIGN PATENT DOCUMENTS

EP   0993996 A2   4/2000
EP   0993996 A3   4/2003
(Continued)

OTHER PUBLICATIONS

Texas Instruments "LM340, LM340A and LM7805 Family Wide VIN 1.5-A Fixed Voltage Regulators" Retrieved from the Internet: <URL:https://www.mouser.com/datasheet/2/405/lm7805-973141. pdf> (Year: 2016).*

(Continued)

*Primary Examiner* — Jared Fureman
*Assistant Examiner* — Nicolas Bellido (57) ABSTRACT

The embodiment of the present disclosure discloses a jumper cable and an ignition control method, which are applicable to the field of electronic technology. The jumper cable includes a main control module, and a startup detection module, a voltage-stabilizing power supply module, a voltage detection module, a temperature detection module, a relay control module, a startup communication module, a positive ignition clip and a negative ignition clip connected with the main control module. The relay control module includes a relay switch. The first end of the relay switch is connected with the voltage-stabilizing power supply module, which is connected with the positive ignition clip. The second end of the relay switch is connected with the startup detection module and the negative ignition clip. The startup communication module is connected with the startup power supply.

9 Claims, 6 Drawing Sheets

(51) Int. Cl.
*G01R 31/58* (2020.01)
*B60S 5/00* (2006.01)

(58) Field of Classification Search
CPC ......... F02N 2300/2011; H01M 10/486; H01M 2010/4278; H02H 1/0007; H02H 7/20; H02J 7/0029; H02J 7/00302; H02J 7/00308; H02J 7/00309; H02J 7/00304; H02J 7/0031; H02J 7/0034; H02J 7/0036
See application file for complete search history.

(56) References Cited

U.S. PATENT DOCUMENTS

| | | | | |
|---|---|---|---|---|
| 11,303,122 B1* | 4/2022 | Zhu | ....................... | H01R 11/24 |
| 2009/0174362 A1* | 7/2009 | Richardson | ........... | H02J 7/0034 |
| | | | | 320/105 |
| 2009/0218988 A1* | 9/2009 | Richardson | ......... | H02J 7/00309 |
| | | | | 320/134 |
| 2013/0154543 A1* | 6/2013 | Richardson | ............. | H02J 7/007 |
| | | | | 320/109 |
| 2016/0082854 A1* | 3/2016 | Richardson | ......... | H02J 7/00304 |
| | | | | 320/105 |
| 2018/0111491 A1* | 4/2018 | Nook | .................... | H02J 7/0034 |
| 2019/0081472 A1* | 3/2019 | Guo | ...................... | H02J 7/0031 |

FOREIGN PATENT DOCUMENTS

| | | | | |
|---|---|---|---|---|
| EP | 3264515 B1 | * | 4/2019 | ............ H01M 10/44 |
| GB | 2527858 A | * | 1/2016 | ............. B60L 53/14 |
| WO | WO2017139524 A1 | | 8/2017 | |

OTHER PUBLICATIONS

Office Action issued for Application No. 21162343.4-1004, dated Jul. 9, 2021.

* cited by examiner

JUMPER CABLE AND METHOD TO JUMP START AN AUTOMOBILE

TECHNICAL FIELD

The disclosure relates to the field of electronic technology, and particularly relates to a novel jumper cable and a method to jump start an automobile.

BACKGROUND

Automobiles adopt an ignition system controlled by a microprocessor. The displacement of automobiles is different, so the current, voltage and power required for ignition and startup are also different, so do the under-voltage and damage degree of the batteries on automobiles. Therefore, jumper cables with different functions are produced, such as MOS (Metal-Oxide-Semiconductor Field-Effect Transistor, MOSFET) tube-controlled type, power-diode type, straight-through type, and other types.

However, the jumper cables of the aforesaid types have their own technical defects. For the MOS tube-controlled jumper cables, a plurality of technical defects may appear. For example, it is difficult to enable the automobiles to start with a large displacement and it is prone to burn the MOS tube due to overheating; fail to detect the completion of ignition action even after a successful ignition, the ignition circuit cannot be disconnected and fail to enable the ignition function after a damage of the battery. For the jumper cables controlled by power diode, it is also difficult to start the automobiles with a large displacement, prone to burn the diode due to over temperature and no protection for short circuit; unable to detect the completion of ignition action even after a successful ignition and the ignition circuit cannot be disconnected. For straight-through jumper cables, no reverse connection protection is provided. It is thus clear that the jumper cables of the aforesaid types are easy to be damaged and fail to ignite.

SUMMARY

The disclosure provides a novel jumper cable and a method to jump start an automobile. The disclosure aims to solve the technical problems that the existing jumper cables are easy to be damaged and the ignition is easy to fail.

The embodiment of the disclosure provides a novel jumper cable, comprising:

a main control module, a startup detection module, a voltage-stabilizing power supply module, a voltage detection module, a temperature detection module, a relay control module, a startup communication module, a positive ignition clip and a negative ignition clip; wherein the startup detection module, the voltage detection module, the temperature detection module, the relay control module and the startup communication module are all connected with the main control module;

the relay control module comprises a relay switch having a first end connected with the voltage-stabilizing power supply module and a second end connected with the startup detection module and the negative ignition clip, the voltage-stabilizing power supply module is also connected with the positive ignition clip, the startup communication module is also connected with the startup power supply;

wherein the main control module is configured to send an "ON" signal after delaying a preset first delay time and the relay control module is configured to control the relay switch to couple according to the "ON" signal when detected signals of the startup detection module, the voltage detection module, the temperature detection module and the startup communication module are normal, the main control module is also configured to send an "OFF" signal to the relay control module and the relay control module is configured to control the relay switch to turn off according to the "OFF" signal after ignition action is completed, and the main control module is further configured to send an "OFF" signal to the relay control module when it reaches a preset time period after the relay switch is coupled, and the relay control module is configured to control the relay switch to turn off accordingly.

The embodiment of the disclosure provides a method to jump start an automobile, using the above jumper cable to control the ignition. The method comprises:

wherein the method comprises the steps of:

acquiring detection signals of the startup detection module, the voltage detection module, the temperature detection module and the startup communication module of the jumper cable;

when the detected signals are normal, the main control module sending an "ON" signal after delaying a preset first-delay time, and the relay control module controlling the relay switch to couple according to the "ON" signal;

the main control module sending an "OFF" signal to the relay control module after ignition is completed, and the relay control module controlling the relay switch to be turned off, the main control module sending an "OFF" signal to the relay control module and the relay control module controlling the relay switch to be turned off when it reaches a preset limit time after the replay switch is coupled;

when there is abnormity in the detected signals, the main control module determining a direct ignition, or stopping the ignition and prompting the abnormity according to the abnormal detected signal.

According to the embodiment of the disclosure, the jumper cable includes a main control module, and a startup detection module, a voltage-stabilizing power supply module, a voltage detection module, a temperature detection module, a relay control module, and a startup communication module that are all connected with the main control module. The main control module receives detected signals from these modules. When these detected signals are normal, the main control module sends an "ON" signal to the relay control module after a time delay, and the relay switch is coupled to prepare for ignition. After the completion of ignition is detected, the main control module sends an "OFF" signal and the relay control module disconnects the relay switch and prompts that the ignition is successful. Moreover, within a set time duration after an ignition is started, the main control module turns off the relay switch by the relay control module to switch off the ignition regardless of whether the user operates the ignition or not. The novel jumper cable can achieve the purpose of detecting whether the operating state of the novel jumper cable is normal or not before ignition, which can improve the success rate of ignition. The ignition circuit can be disconnected after a successful ignition, and the ignition function can be switched off promptly regardless of whether the ignition is successful or not, so as to prevent the damage caused by abnormal voltage and temperature, and prolong the service life of the components.

BRIEF DESCRIPTION OF THE DRAWINGS

In order to clearly explain the technical scheme in the embodiments or the prior art of the disclosure, the drawings used in the description of the embodiments or prior arts will be briefly introduced below. Evidently, the drawings in the following description only show some embodiments of the present disclosure.

DESCRIPTION OF THE EMBODIMENTS

In order to make the inventive objects, features and advantages of the present disclosure more obvious and understandable, the technical scheme in the embodiments of the present disclosure will be described clearly and completely in combination with the drawings in the embodiments of the present disclosure. Evidently, the described embodiments are only parts of embodiments, but not all embodiments of the present disclosure. Based on the embodiments of the present disclosure, all other embodiments obtained by those skilled in the art without creative labor belong to the scope of the protection of the present disclosure.

Figure 1:
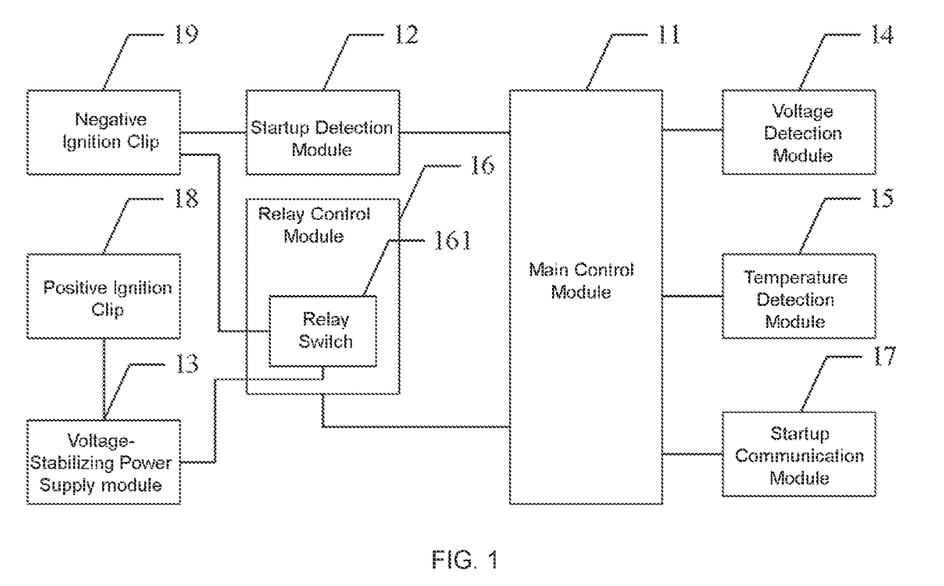
FIG. 1 is a schematic structural diagram of a novel jumper cable according to an embodiment of the present disclosure.

Referring to FIG. 1, it is a schematic structural diagram of a novel jumper cable according to an embodiment of the present disclosure. The novel jumper cable can be applied to an electronic system of automobiles in which ignition is needed for startup. The following describes an embodiment of ignition of automobiles. The novel jumper cable mainly comprises:

A main control module 11, a startup detection module 12, a voltage-stabilizing power supply module 13, a voltage detection module 14, a temperature detection module 15, a relay control module 16, a startup communication module 17, a positive ignition clip 18 and a negative ignition clip 19;

The startup detection module 12, the voltage detection module 14, the temperature detection module 15, the relay control module 16 and the startup communication module 17 are all connected with the main control module 11;

The relay control module 16 includes a relay switch 161. The first end of the relay switch 161 is connected with the voltage-stabilizing power supply module 13. The voltage-stabilizing power supply module 13 is also connected with the positive ignition clip 18. The second end of the relay switch 161 is connected with the startup detection module 12 and the negative ignition clip 19. The positive ignition clip 18 and the negative ignition clip 19 are connected respectively with the anode and cathode of the battery of automobile.

The main control module 11 includes a main control chip 111 and surrounding circuits. The main control chip is a MCU (microcontroller unit) the specific model of which can be LGM626F2X. The main control module 11 is used to establish the detection and control systems of the novel jumper cable.

When the positive ignition clip 18 and the negative ignition clip 19 are connected to the battery, the main control module 11 can judge whether the positive ignition clip 18 and the negative ignition clip 19 are connected correctly and successfully to the battery according to the voltage of startup detection module 12.

The main control module 11 detects whether an automobile has a battery or the battery is damaged via the startup detection module 12. It is determined that the automobile has no battery when an internal resistance of electrical appliances on the automobile is obtained by a preset algorithm according to the detected voltage of startup detection module 12, for example, the internal resistance is 20Ω to 50Ω. It is determined that the battery of the automobile is damaged when the voltage of automobile battery derived by detecting the voltages of startup detection module 12 and voltage detection module 14 exceeds the preset damage voltage threshold. For example, the voltage threshold of the damaged battery may be 2V-7.5V. The damage of a battery means that there is failure in the battery, such as, under-voltage, open circuit, etc.

When it is confirmed that there is no battery in automobiles or the battery is damaged, the main control module 11 starts the normal ignition process, which is not affected by the aforesaid problems about the battery.

One end of the voltage detection module 13 can be connected to a power supply, for example, an automobile battery or a startup power supply. The main control module 11 can judge whether the voltages of the battery and the startup power supply are normal by detecting the voltage of the voltage detection module 13, and judge whether ignition is successful according to the voltage of the battery;

The main control module 11 can detect the temperature of the novel jumper cable via the temperature detection module 14. When the temperature is too low or too high, the main control module prompts an over-temperature protection and sends a signal to the relay control module 16 to switch off or switch on the relay switch 161 so as to switch off or switch on the ignition function.

The startup communication module 17 is also connected with the startup power supply 30 to receive the voltage signal from the startup power supply 30. The main control module 11 can judge the abnormities of temperature, under-voltage, overvoltage, overcurrent and short circuit of the startup power supply 30 by detecting the voltage of the startup communication module 17.

When the detected signals of the startup detection module 12, the voltage detection module 14, the temperature detection module 15 and the startup communication module 17 are normal, a normal detected signal means that the detected voltages and temperatures are all within the preset normal numerical range, the main control module 11 sends an "ON" signal after delaying a preset first delay time, and the relay control module 16 controls the relay switch 161 to couple and switch on the circuit. The first delay time can be preset to be, for example, 0.5 seconds. When the completion of ignition is detected, the main control module 11 sends an "OFF" signal to the relay control module 16 to control the disconnecting of the relay switch 161 and meanwhile the main control module 11 prompts that the ignition is successful. Regardless of whether the ignition is successful or not, the main control module 16 will send an "OFF" signal to the relay control module 16 when it reaches a preset limit time duration after the switch is coupled, and then the relay control module 16 disconnects the relay switch 161. This preset limit time duration can be set according to the characteristic of the ignition system, for example, set to be 30 seconds.

Further, the main control module 11 confirms a direct ignition according to the specific conditions of the abnormity, or temporarily does not enter the ignition process and sends out a prompt of an abnormity simultaneously if the detection signals received from the startup detection module 12, the voltage detection module 14, the temperature detection module 15 and the startup communication module 17 are abnormal.

In an embodiment of the present disclosure, the jumper cable includes a main control module, and a startup detection module, a voltage-stabilizing power supply module, a voltage detection module, a temperature detection module, a relay control module, and a startup communication module that are all connected with the main control module. The main control module receives detected signals from these modules. When these detected signals are normal, the main control module sends an "ON" signal to the relay control module after a time delay, and the relay switch is coupled to prepare for ignition. After the completion of ignition is detected, the main control module sends an "OFF" signal and the relay control module disconnects the relay switch and prompts that the ignition is successful. Moreover, within a set time duration after an ignition is started, the main control module turns off the relay switch by the relay control module to switch off the ignition regardless of whether the user operates the ignition or not. The novel jumper cable can achieve the purpose of detecting whether the operating state of the novel jumper cable is normal or not before ignition, which can improve the success rate of ignition. The ignition circuit can be disconnected after a successful ignition, and the ignition function can be switched off promptly regardless of whether the ignition is successful or not, so as to prevent the damage caused by abnormal voltage and temperature, and prolong the service life of the components.

Figure 2:
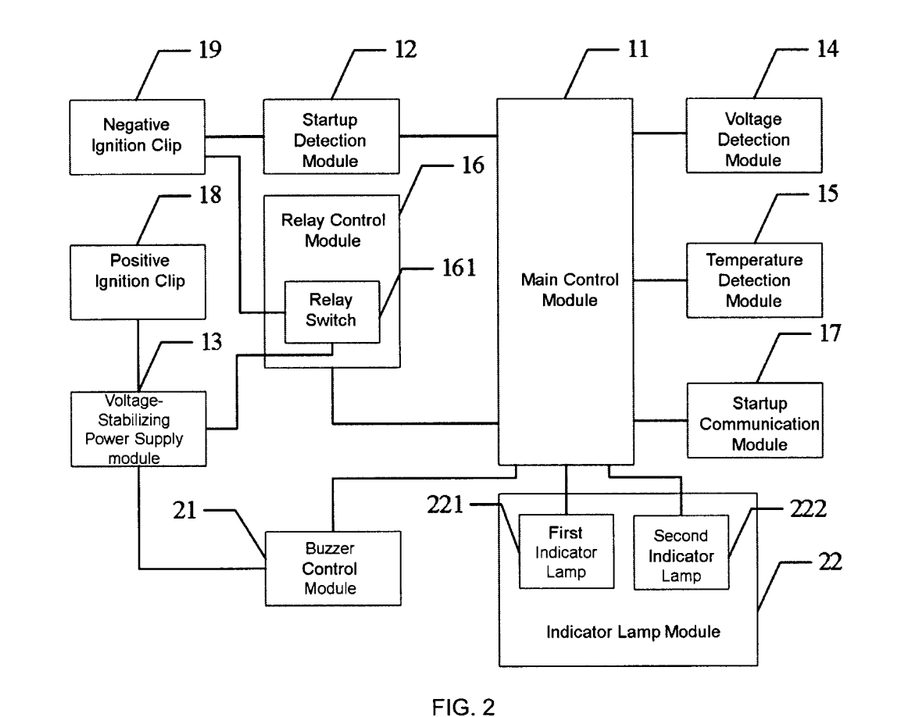
FIG. 2 is a schematic structural diagram of a novel jumper cable according to another embodiment of the present disclosure.

Further, referring to FIG. 2, it is a schematic structural diagram of a novel jumper cable according to another embodiment of the present disclosure. In this embodiment, the novel jumper cable further includes a buzzer control module 21 connected with the main control module 11, wherein the buzzer control module 21 includes a buzzer. The buzzer control module 21 drives the buzzer to alarm according to the instructions of the main control module 11.

Further, the novel jumper cable further includes an indicator lamp module 22, which includes a first indicator lamp 221 and a second indicator lamp 222. The first indicator lamp 221 and the second indicator lamp 222 are both connected with the main control module 11, and the color of the first indicator lamp 221 after lighting is different from that of the second indicator lamp 222 after lighting. For example, the color of the first indicator lamp 221 is green, while the color of the second indicator lamp 222 is red, or vice versa, or they are other different colors. The two indicator lamps can be LED (Light Emitting Diode) lamps. According to the received control signals sent by the main control module 11, the indicator lamp module 22 can achieve respectively the indications that present different meanings, such as, the first indicator lamp 221 is constantly ON, the second indicator lamp 222 is constantly ON, or the first indicator lamp 221 and the second indicator lamp 222 are alternating flashing. Taking the first indicator lamp 221 in green light and the second indicator lamp 222 in red light as an example, the constant ON of the green light means that voltage, temperature and other detected parameters are normal, and the constant ON of the red light means that voltage, temperature and other detected parameters are abnormal. If the red light and green light are alternately flashing, it may indicate that the novel jumper cable is working normally.

Figure 3:
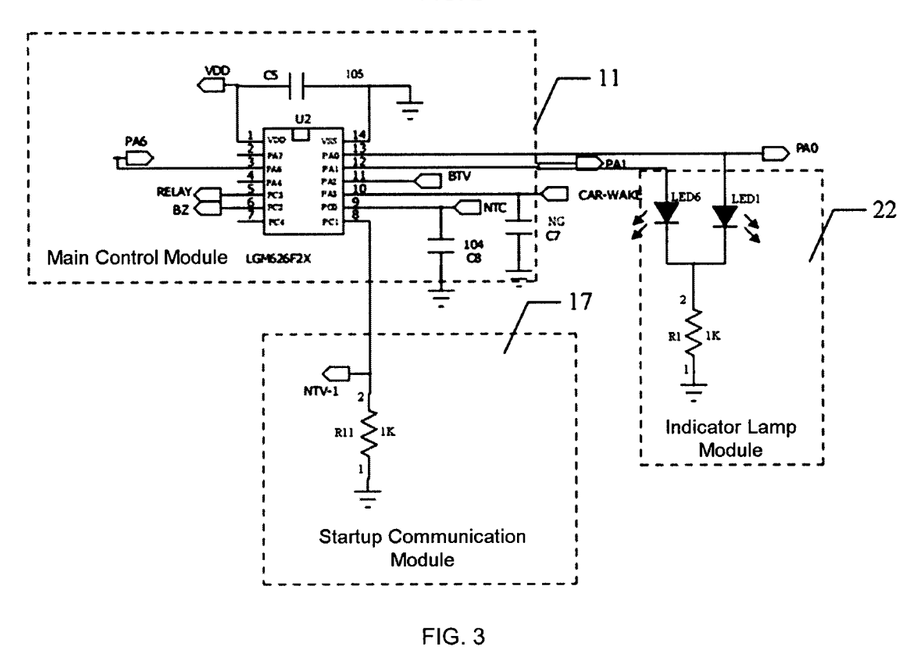
FIG. 3 is a schematic circuit structure diagram of a novel jumper cable according to an embodiment of the present disclosure.

Further, the specific circuit structure of the novel jumper cable is shown in FIG. 3. The 10th pin of the main control chip 111 is connected with the startup detection module 12 (i.e. CAR-WAKE in FIG. 3), the 11th pin is connected with the voltage detection module 13 (i.e. BTV in FIG. 3), the 9th pin is connected with the temperature detection module 15 (i.e. NTC in FIG. 3), the 8th pin is connected with the startup communication module 17, the 6th pin is connected with the buzzer control module 21 (i.e. BZ in FIG. 3), the 7th pin is connected with the relay control module 16 (i.e. RELAY in FIG. 3), the 12th pin is connected with the first indicator lamp LED 6 and the 13th pin is connected with the second indicator lamp LED 1.

Figure 4:
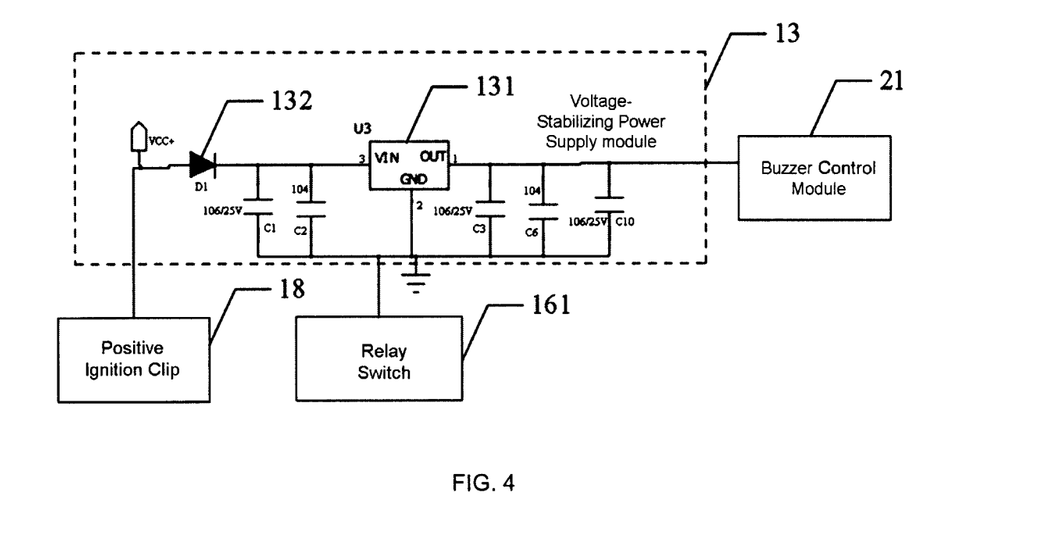
FIG. 4 is a schematic diagram shows structure and connection relationship of a voltage-stabilizing power supply module in a novel jumper cable according to an embodiment of the present disclosure.

Further, referring to FIG. 4, it is a schematic diagram shows structure and connection relationship of the voltage-stabilizing power supply module 13. The voltage-stabilizing power supply module 13 provides a stable electric operating voltage for the novel jumper cable, and it includes a voltage-stabilizing power supply chip 131 (i.e. U3 in FIG. 3) with an input terminal, an output terminal and a grounding terminal. The specific model of the voltage-stabilizing power supply chip 131 can be LM78L05; and a diode 132 (i.e. D1 in FIG. 4), whose specific mode can be IN4148. The anode of the diode 132 is connected to the positive ignition clip 18 and the cathode is connected to the input terminal of the voltage-stabilizing power supply chip 131. The output terminal of the voltage-stabilizing power supply chip 131 is connected with the buzzer control module 21.

Further, as shown in FIG. 4, the anode of the diode 132 is further connected with the anode of power supply, and the input terminal and output terminal of the voltage-stabilizing power supply chip 131 are respectively connected with a plurality of capacitors. The capacitance values of these capacitors are determined according to the requirements of the automobile circuits, and they are not limited herein.

Figure 5:
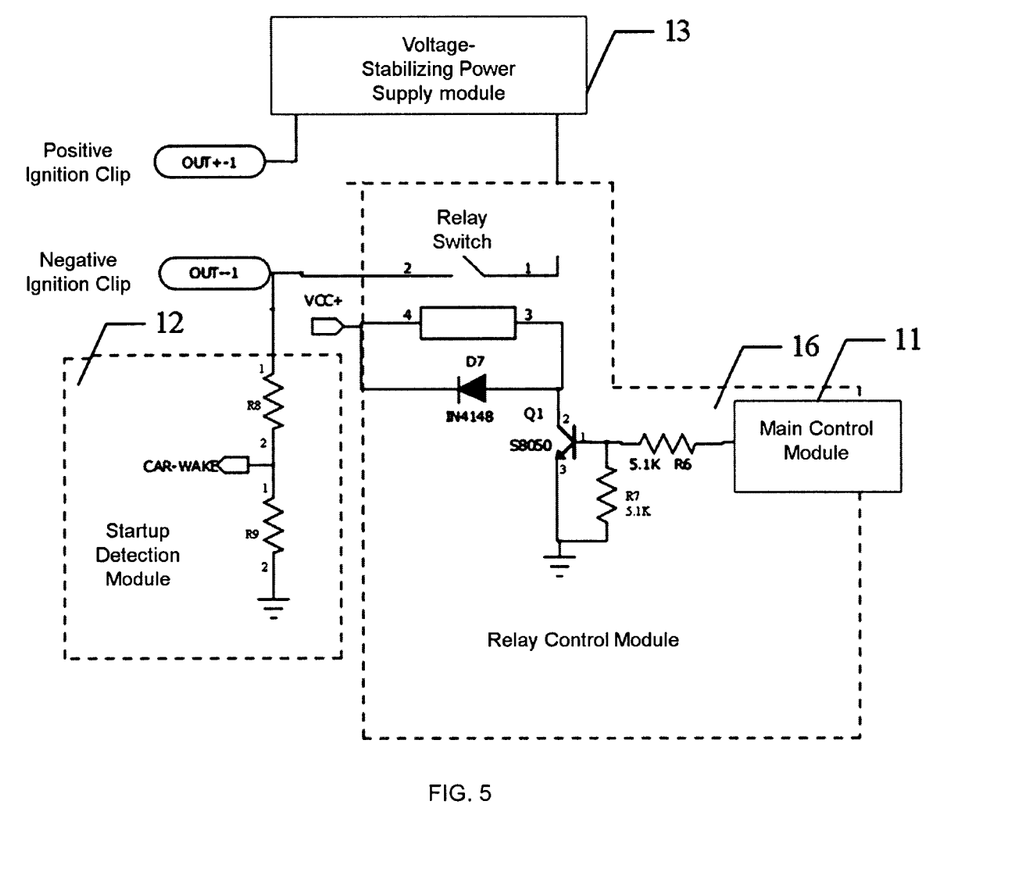
FIG. 5 is a schematic diagram shows structure and connection relationship of a startup detection module in a novel jumper cable according to an embodiment of the present disclosure.

Further, referring to FIG. 5, it is a schematic diagram of structure and connection relationship of the startup detection module 14. The startup detection module 14 includes a first resistor R8 and a second resistor R9;

The first end of the first resistor R8 is connected with the main control module 11 and the first end of the second resistor R9, and the second end of the first resistor R8 is connected with the negative ignition clip 19. The second end of the second resistor R9 is grounded.

When the positive ignition clip 18 and the negative ignition clip 19 are connected to a battery, the main control module 11 determines that the positive ignition clip 18 and the negative ignition clip 19 are connected correctly when it detects that the voltage of the startup detection module 14 is within a preset access voltage range, for example 2 V to 12

V, then the main control module 11 controls the indicator lamps to light up according to the preset first mode, for example, controlling the first indicator lamp 221 to constantly light up and controlling the novel jumper cable to enter the next process of ignition. Specifically, the main control module can control the relay control module 16 to make the relay switch 161 couple. When the main control module 11 determines that the positive ignition clip 18 and the negative ignition clip 19 are connected incorrectly (that is, the positive and negative electrodes are connected reversely) when it detects that the voltage of the startup detection module 14 is higher than the maximum value of a present access voltage range, for example, 12, then the main control module 11 controls the indicator lamps to light up according to the present second mode, for example, controlling the second indicator lamp 222 to constantly light up, and sends an alarm signal to the buzzer control module 21, which controls the buzzer to alarm, for example, several short beeps, so as to achieve the judgment of a positive connection or reverse connection between the positive ignition clip 18 and the negative ignition clip 19, and indicate the positive connection or reserve connection through the indicator lamps and the buzzer;

Further, the relay control module 16 controls the relay switch 161 to couple and start the preparation for ignition after the main control module 11 sends the ON command. The main control module 11 controls the relay control module 16 to switch off the relay switch 161 every preset seconds (e.g. 5 seconds) for a preset time duration, which is very short, e.g. 0.15 seconds. When the main control module 11 detects that the voltage of the startup detection module is decreased to zero within the preset time duration, then confirms that the novel jumper cable is disconnected from the batter, it then controls the indicator lamps to light up according to the preset third mode, for example, sending the control commands to the first indicator lamp 221 and the second indicator lamp 222, respectively, to control the first indicator lamp 221 and the second indicator lamp 222 to flash alternately, so as to achieve the purpose of detecting whether the novel jumper cable is removed from the battery.

Figure 6:
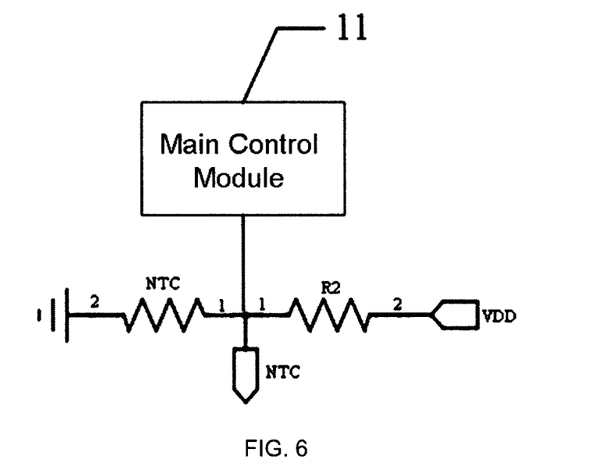
FIG. 6 is a schematic diagram shows structure and connection relationship of a temperature detection module in a novel jumper cable according to an embodiment of the present disclosure.

Further, referring to FIG. 6, it is a schematic diagram of structure and connection relationship of the temperature detection module 15. The temperature detection module 15 includes a thermistor NTC and a third resistor R2;

The thermistor is specifically a NTC (Negative Temperature Coefficient) thermistor.

The first end of the thermistor NTC is connected with the first end of the third resistor R2 and the main control module 11. The second end of the thermistor NTC is grounded;

The main control module 11 gives a prompt of low-temperature protection or high-temperature protection when it detects that the voltage of the temperature detection module 15 is higher than the preset low-temperature protection voltage or lower than the preset high-temperature protection voltage. For example, the preset low-temperature protection voltage is 4.3V, so the 60° C. high-temperature protection is performed when the voltage is higher than 4.3V; the preset low-temperature protection voltage is 1.2V, so the −20° C. low-temperature protection is performed when the voltage is lower than 1.2V. After giving a prompt, the main control module 11 controls the indicator lamps to light up according to the second mode, that is, sending a control signal to the second indicator lamp 222 to control it to constantly light up, and sending a control signal to the buzzer control module 21 to control it to beep and alarm shortly and constantly.

Figure 7:
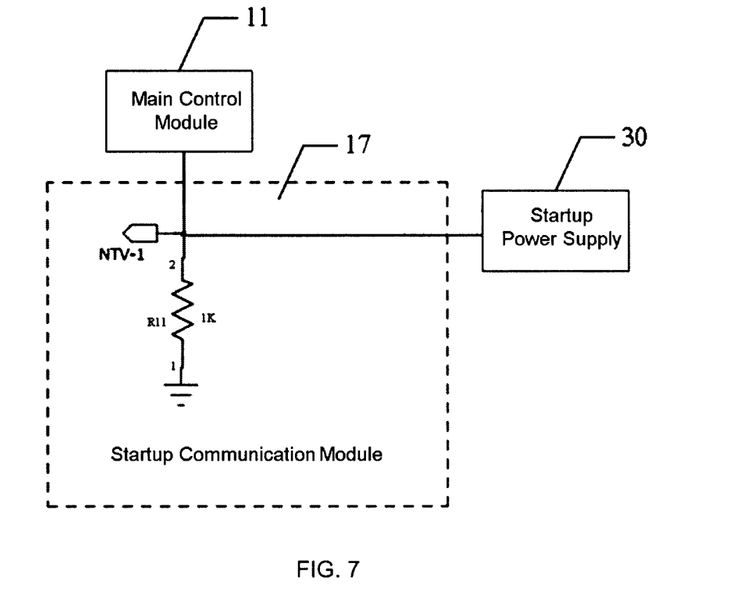
FIG. 7 is a schematic diagram shows structure and connection relationship of a startup communication module in a novel jumper cable according to an embodiment of the present disclosure.

Further, referring to FIG. 7, it is a schematic diagram of structure and connection relationship of the startup communication module 17. The startup communication module 17 includes a fourth resistor R11. The first end of the fourth resistor R11 is connected with the main control module 11 and the startup power supply 30. The second end of the fourth resistor R11 is grounded.

Specifically, the startup communication module 17 is connected to the startup power supply 30 via EC5. EC5 includes an anode, a cathode and a data cable, wherein the data cable is connected with the startup communication module 17. The startup communication module 17 can obtain information from the startup power supply 30 such as battery voltage, battery temperature, operating state and the like, and correspondingly achieve the protective measures for abnormal voltage, abnormal temperature, etc.

The main control module 11 starts the corresponding protection prompt processes, for example, controlling the second indicator lamp 222 to be constantly ON, and the buzzer of the buzzer control module 21 to beep and alarm shortly and constantly when it obtains the abnormal signals such as under-voltage, over-voltage, and over-temperature from the startup power supply 30 via the startup communication module 17.

Further, still referring to FIG. 5, it is also a schematic diagram of structure and connection relationship of the relay control module 16.

The relay control module 16 further includes a fifth resistor R6 and a triode Q1;

One end of the fifth resistor R6 is connected with the main control module 11 and the other end of the fifth resistor R6 is connected with the base electrode of the transistor Q1.

Figure 8:
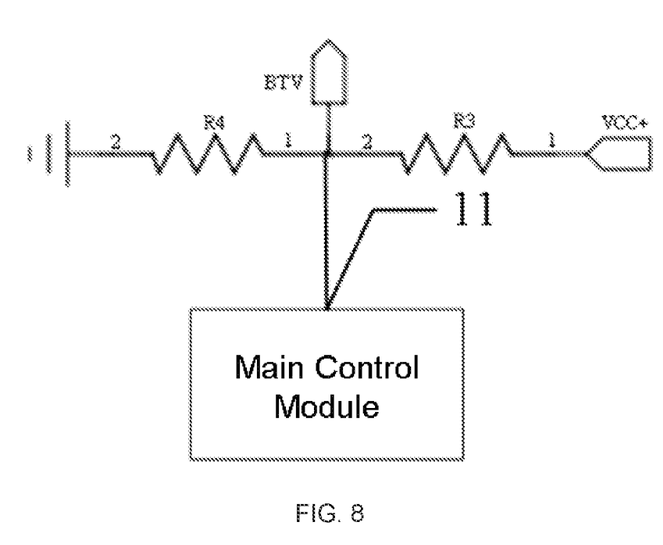
FIG. 8 is a schematic diagram shows structure and connection relationship of a voltage detection module in a novel jumper cable according to an embodiment of the present disclosure.

Further, the main control module 11 can judge whether ignition is successful or not and judge whether the startup power supply of the novel jumper cable is under-voltage, over-voltage, over-current or short-circuit by detecting the voltage value of the voltage detection module 14.

I. Judge Whether the Ignition is Successful

Referring to FIG. 8, it is a schematic diagram of structure and connection relationship of the voltage detection module 14. The voltage detection module 14 includes a sixth resistor R3 and a seventh resistor R4;

The first end of the sixth resistor R3 is connected with the main control module 11, the first end of the seventh resistor R4 and the anode of the battery, and the second end of the sixth resistor R3 is connected with the anode of the power supply. The second end of the seventh resistor R4 is grounded;

The main control module 11 detects and records the first voltage and the first time of the voltage detection module 14 when the battery or the startup power supply 30 is switched on (before ignition). During an ignition, the voltage will decrease. The main control module 11 detects and records the second voltage and the second time when the voltage of the voltage detection module 14 decreases during the ignition, as well as the third voltage and the third time when it increases again. Generally, the main control module 11 will automatically detect it when the battery or the battery component of the startup power supply 30 is turned on, and the values of the aforesaid voltages correspond to the switch-on battery or the battery component of the startup power supply 30. Furthermore, the main control module 11 judges whether the ignition is successful or not according to the detected voltages and times and the preset ignition success logic, that is, it records the current battery voltage with a delay of two seconds after the startup power supply and the automobile battery are switched on. In the process of ignition, the voltage fluctuation state and the increased value and the increased value are detected in a real-time manner for comparison and calculation. The ignition will be deemed as successful when the preset values are reached.

II. Judge Whether the Startup Power Supply of the Novel Jumper Cable is Under-Voltage, Over-Voltage, Over-Current, or Short-Circuit;

Still referring to FIG. 8, the voltage detection module 14 includes the sixth resistor R3 and the seventh resistor R4;

The first end of the sixth resistor R3 is connected with the main control module 11, the first end of the seventh resistor R4 and the anode of the startup power supply 30. The second end of the seventh resistor R4 is grounded;

When the main control module 11 detects that the voltage of the voltage detection module 14 is higher than the preset first input voltage or lower than the preset second input voltage, it controls the indicator lamps to light up according to the second mode, that is, controlling the second indicator lamp 221 to constantly light up and controlling the buzzer of buzzer control module 21 to beep and alarm shortly and constantly. For example, when the startup power supply 30 is the 3-series batteries, the preset first input voltage is 13V and the preset second input voltage is 10.5V; when the startup power supply is the 4-series batteries, the preset first input voltage is 17V and the preset second input voltage is 14V;

When the relay control module 16 controls the relay switch 161 to couple, and the main control module 11 detects that the voltage of the voltage detection module 14 is lower than a preset third input voltage and lasts for a first input time duration, or detects that the voltage of the voltage detection module 14 is lower than a preset fourth input voltage and lasts for a second input time duration, or, detects that the voltage of the voltage detection module 14 is lower than a preset fifth input voltage and lasts for a third input time duration, then it controls the indicator lamps to light up according to the second mode, that is, controlling the second indicator lamp 222 to constantly light up and the buzzer of the buzzer control module 21 to beep and alarm shortly and constantly. The preset third input voltage, the fourth input voltage and the fifth input voltage are successively decreased, and the first input time duration, the second input time duration and the third input time duration are successively decreased. For example, the third input voltage is 9V, and the first input time duration is 3 seconds; the fourth input voltage is 7V and the second input time duration is 2 seconds; the fifth input voltage is 5V, and the third input time duration is 0.05 seconds, and the like.

Figure 9:
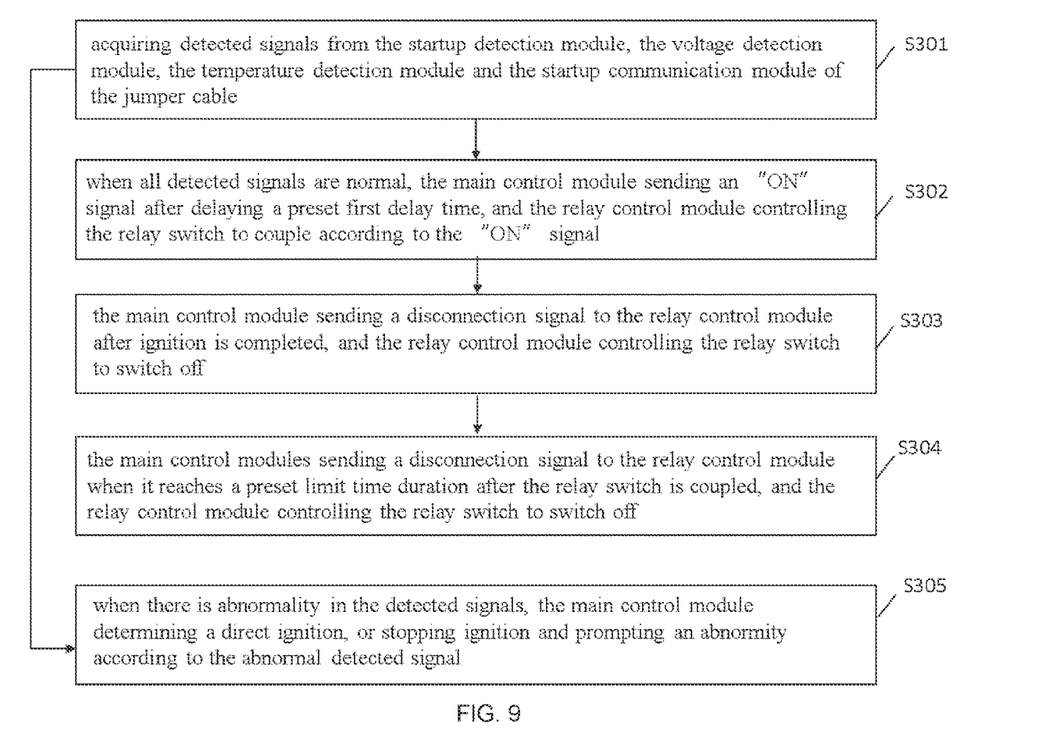
FIG. 9 is a flow chart of a method to jump start an automobile according to an embodiment of the present disclosure.

Please referring to FIG. 9, it is a flow chart of a method to jump start an automobile. This method uses the novel jumper cable as shown in FIGS. 1 to 8 to judge the ignition. This method mainly includes:

S301: acquiring detected signals from the startup detection module, the voltage detection module, the temperature detection module and the startup communication module of the jumper cable;

S302: when all detected signals are normal, the main control module sending an "ON" signal after delaying a preset first delay time, and the relay control module controlling the relay switch to couple according to the "ON" signal;

S303: the main control module sending a disconnection signal to the relay control module after ignition is completed, and the relay control module controlling the relay switch to switch off; S304: the main control modules sending a disconnection signal to the relay control module when it reaches a preset limit time duration after the relay switch is coupled, and the relay control module controlling the relay switch to switch off;

S305: when there is abnormality in the detected signals, the main control module determining a direct ignition, or stopping ignition and prompting an abnormity according to the abnormal detected signal.

Specifically, when it is confirmed that there is no battery for an automobile or its battery is damaged, the main control module starts the normal ignition process and directly ignites, which is not affected by the problems about the battery.

However, in case of any abnormity for the startup power supply, such as, under-voltage, over-voltage or over-temperature, or a reverse connection of the novel jumper cable, the ignition will not be carried out temporarily, and the abnormity will be prompted by controlling the indicator lamps and the buzzer.

The structure, connection mode and working principle of the novel jumper cable in this embodiment refer to the description of the previous embodiments.

In this embodiment, the main control module judges whether the ignition is successful via the detected signals from the startup detection module, the voltage detection module, the temperature detection module and the startup communication module in the novel jumper cable. It switches off the relay switch in a timely manner after the ignition is successful, or switches off the relay switch forcibly within a certain time after an unsuccessful ignition, to prevent the novel jumper cable and automobile parts to be damaged due to the failure of switching off the circuit after the unsuccessful ignition, so as to improve the service life of the spare parts. Moreover, the main control module confirms a direct ignition, or stops ignition and prompts the abnormity according to the abnormal detected signals, so as to improve the success rate of ignition, avoid the damage of novel jumper cable and automobile parts caused by abnormal voltage and temperature, and prolong the service life of parts.

In the aforesaid embodiments, the description of each embodiment has its own emphasis. Those parts that are not detailed in certain embodiment can refer to the relevant descriptions of other embodiments.

The above is a description of the novel jumper cable and method to jump start an automobile according to the present disclosure. For those skilled in art, there will be some changes in the specific embodiment mode and application scope according to the ideas of the embodiments of the present disclosure. In summary, the contents of this specification shall not be construed as a restriction of the present disclosure.

What is claimed is:

1. A jumper cable, comprising:
   a main control module, a startup detection module, a voltage-stabilizing power supply module, a voltage detection module, a temperature detection module, a relay control module, a startup communication module, a positive ignition clip and a negative ignition clip; wherein
   the startup detection module, the voltage detection module, the temperature detection module, the relay control module and the startup communication module are all connected with the main control module;
   the relay control module comprises a relay switch having a first end connected with the voltage-stabilizing power supply module and a second end connected with the startup detection module and the negative ignition clip, the voltage-stabilizing power supply module is also connected with the positive ignition clip, the startup communication module is also connected with a startup power supply;

wherein the main control module is configured to send an "ON" signal after delaying a preset first delay time and the relay control module is configured to control the relay switch to couple according to the "ON" signal when detected signals of the startup detection module, the voltage detection module, the temperature detection module and the startup communication module are normal, the main control module is also configured to send an "OFF" signal to the relay control module and the relay control module is configured to control the relay switch to turn off according to the "OFF" signal after ignition action is completed, and the main control module is further configured to send an "OFF" signal to the relay control module when it reaches a preset time period after the relay switch is coupled, and the relay control module is configured to control the relay switch to turn off accordingly, wherein the startup detection module comprises a first resistor and a second resistor;

wherein a first end of the first resistor is connected with the main control module and a first end of the second resistor, a second end of the first resistor is connected with the negative ignition clip, and a second end of the second resistor is grounded;

wherein the main control module is configured to control the indicator lamps to light up according to a preset first mode when it detects that a voltage is in a preset access voltage range, and the main control module is configured to control the indicator lamps to light up according to a preset second mode and to control the buzzer control module to beep and alarm when it detects that the voltage is higher than a maximum voltage of the preset access voltage range; and wherein the main control module is configured to control the relay control module to turn off the relay switch every preset seconds for a preset time duration after the relay control module controls the relay switch to couple, wherein the main control module is configured to control the indicator lamps to light up according to a preset third mode when the main control module detects that the voltage of the startup detection module decreases to 0 within the preset time duration.

2. The jumper cable according to claim 1, further comprising: a buzzer control module and an indicator lamp module; wherein the buzzer control module is connected with the main control module and the voltage-stabilizing power supply module, and is configured to perform buzzer alarm according to instructions from the main control module; and the indicator lamp module comprises a plurality of indicator lamps with different colors, and the plurality of indicator lamps are all connected with the main control module.

3. The jumper cable according to claim 2, wherein the voltage-stabilizing power supply module comprises a diode, and a voltage-stabilizing power supply chip with an input terminal, an output terminal and a grounding terminal;

wherein an anode of the diode is connected with the positive ignition clip, and a cathode of the diode is connected with the input terminal of the voltage-stabilizing power supply chip; and wherein the output terminal of the voltage-stabilizing power supply chip is connected with the buzzer control module.

4. The jumper cable according to claim 1, wherein the temperature detection module comprises a thermistor and a third resistor;

wherein a first end of the thermistor is connected with a first end of the third resistor and the main control module, and a second end of the thermistor is grounded; and wherein the main control module is configured to control the indicator lamps to light up according to the second mode and control the buzzer control module to beep and alarm when it detects that a voltage of the temperature detection module is higher than a preset low-temperature protection voltage or lower than a preset high-temperature protection voltage.

5. The jumper cable according to claim 4, wherein the startup communication module comprises a fourth resistor; and wherein the fourth resistor has a first end connected with the main control module and the startup power supply, and a second end which is grounded.

6. The jumper cable according to claim 5, wherein the relay control module further comprises a fifth resistor and a triode; and wherein one end of the fifth resistor is connected with the main control module and another end of the fifth resistor is connected with a base of the triode.

7. The jumper cable according to claim 6, wherein the voltage detection module comprises a sixth resistor and a seventh resistor;

wherein a first end of the sixth resistor is connected with the main control module, a first end of the seventh resistor is connected with an anode of the battery; and a second end of the seventh resistor is grounded; and wherein the main control module is configured to detect a first voltage and a first time of the voltage detection module when the battery is ON, a second voltage and a second time of the voltage detection module when decreasing in a process of ignition, and a third voltage and a third time of the voltage detection module when increasing again, the main control module is configured to judge whether the ignition is successful or not according to the detected voltages and times and a preset ignition success logic.

8. The jumper cable according to claim 6, wherein the voltage detection module comprises a sixth resistor and a seventh resistor;

wherein a first end of the sixth resistor is connected with the main control module, a first end of the seventh resistor and is connected with an anode of the startup power supply, and a second end of the seventh resistor is grounded;

wherein the main control module is configured to control the indicator lamps to light up according to the second mode and control the buzzer control module to beep and alarm when it detects that a voltage of the voltage detection module is higher than a preset first input voltage or lower than a preset second input voltage;

wherein the main control module is configured to control the indicator lamps to light up according the second mode and control the buzzer control module to beep and alarm when the main control module detects that the voltage of the voltage detection module is lower than a preset third input voltage and lasts for a first input time period, or the voltage of the voltage detection module is lower than a preset fourth input voltage and lasts for a second input time period, or the voltage of the voltage detection module is lower than a preset fifth input voltage and lasts for a third input time period; and wherein values of the preset third input voltage, the preset fourth input voltage and the preset fifth input voltage decrease successively, and values of the first input time duration, the second input time duration and the third input time duration decrease successively.

9. A method to jump start an automobile, using a jumper cable according to claim 1, wherein the method comprises the steps of:

acquiring detection signals of the startup detection module, the voltage detection module, the temperature detection module and the startup communication module of the jumper cable;

when the detected signals are normal, the main control module sending an "ON" signal after delaying a preset first-delay time, and the relay control module controlling the relay switch to couple according to the "ON" signal;

the main control module sending an "OFF" signal to the relay control module after ignition is completed, and the relay control module controlling the relay switch to be turned off;

the main control module sending an "OFF" signal to the relay control module and the relay control module controlling the relay switch to be turned off when it reaches a preset limit time after the relay switch is coupled;

when there is abnormity in the detected signals, the main control module determining a direct ignition, or stopping the ignition and prompting the abnormity according to the abnormal detected signal.

* * * * *